(12) United States Patent
Chen

(10) Patent No.: US 6,512,672 B1
(45) Date of Patent: Jan. 28, 2003

(54) MODULAR AIR FLOW DISTRIBUTION SYSTEM

(75) Inventor: Richard S. Chen, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/751,307

(22) Filed: Dec. 29, 2000

(51) Int. Cl.[7] .................................................. H05K 7/20
(52) U.S. Cl. ...................... 361/695; 165/80.3; 361/715; 361/690; 454/184
(58) Field of Search ................. 62/259.2; 361/688–697, 361/715, 752, 725–727; 454/60, 184, 206; 165/80.3, 122–126

(56) References Cited

U.S. PATENT DOCUMENTS

| | | | | |
|---|---|---|---|---|
| 5,027,254 A | * | 6/1991 | Corfits et al. ................ | 361/695 |
| 5,409,419 A | * | 4/1995 | Euchner et al. .............. | 454/184 |
| 5,477,417 A | * | 12/1995 | Ohmori et al. .............. | 361/695 |
| 5,876,278 A | * | 3/1999 | Cheng ........................ | 454/184 |
| 5,926,368 A | * | 7/1999 | Chrysler et al. ............. | 361/695 |
| 6,111,748 A | * | 8/2000 | Bhatia ........................ | 361/695 |

FOREIGN PATENT DOCUMENTS

| | | | | |
|---|---|---|---|---|
| DE | 002738620 | * | 4/1978 | ................ 361/694 |

* cited by examiner

Primary Examiner—Gregory Thompson
(74) Attorney, Agent, or Firm—Sierra Patent Group, Ltd.

(57) ABSTRACT

A modular air flow distribution system that provides directional control of cooling air intake and exiting exhaust air for computer housings and circuit board chassis. The system comprising at least one air flow distribution module that is configured to intake cooling air from a first direction, and exit cooling air in a second, different direction which may be substantially perpendicular or orthogonal to the first direction. Each air flow distribution module includes an air intake adjacent a front edge, air exits adjacent a side edge, and one or more internal air directing channel positioned within the module to direct air from the intake towards the exit ports. The air flow distribution modules are configured to fit adjacent circuit boards within a multi-board chassis such that the air exiting each module passes over a circuit board to provide cooling thereto.

7 Claims, 12 Drawing Sheets

US 6,512,672 B1

MODULAR AIR FLOW DISTRIBUTION SYSTEM

BACKGROUND OF THE INVENTION

1. Field of the Invention

This invention pertains generally to cooling systems and methods for microelectronic components. More particularly, the invention is a modular air flow distribution system, usable for individual printed circuit boards in a chassis, which intakes cooling air in a first direction to cool a printed circuit board, and directs or exits exhaust air away from the circuit board in a second direction which is different from the first direction. The direction of the exhaust air can be controlled to allow optimal positioning of multiple chassis in a work place.

2. Description of the Background Art

A variety of cooling systems have been developed for use with microelectronic components. Many such cooling systems involve directing cooling air past or across a printed circuit (PC) board containing multiple microelectronic components. In many instances, a fan is used draw air into a computer housing or like structure, and across the PC board to provide cooling thereto. The air flow for cooling is generally unidirectional, with cooling air entering the housing at one end, and exhaust air exiting the housing at the opposite end.

As microprocessors achieve higher processing speeds, and as higher density PC board architectures are used, cooling system requirements have become greater. Cooling has generally been provided by increased cooling air flow across the PC boards, and the volume of exhaust air from such cooling systems has accordingly increased. In particular, where multiple PC boards are arranged in a chassis, the volume of exhaust air exiting the chassis is substantial. In some instances, the multiple PC boards can be arranged vertically so that cooling air can be taken in from the bottom of the chassis, and directed upward, out the top of the chassis.

Chassis systems are increasingly used which require horizontal positioning of the PC boards within in the chassis. The horizontal board positioning results in a right-to-left or front-to-back airflow direction for the cooling system used with the chassis. Workspace space must be often be provided to accommodate the relatively large volume of exhaust air. Where multiple chassis are present in one room, as is typically the case, the individual chassis must be positioned so that the exhaust air of one chassis does not interfere with cooling of an adjacent chassis. The positioning of the chassis according to the flow of exhaust air is frequently inconvenient and, results in non-optimal use of work space. A cooling system which effectively provides directional control for the cooling air intake and the exiting exhaust air would overcome this problem. Such a cooling system, however, has not heretofore been available.

There is accordingly a need for an air flow distribution system which provides directional control for intake and exhaust cooling air, and which is usable with individual PC boards in a multiple PC board chassis. The present invention satisfies these needs, as well as others, and generally overcomes the deficiencies found in the background art.

SUMMARY OF THE INVENTION

The invention is a modular air flow distribution system which advantageously provides directional control of cooling air intake and exiting exhaust air for computer housings and circuit board chassis. In its most general terms, the invention is an air flow distribution system comprising at least one air flow distribution module configured to intake cooling air from a first direction, and exit cooling air in a second, different direction. In the presently preferred embodiments, the second direction is substantially perpendicular or orthogonal to the first direction.

By way of example, and not of limitation, the air flow distribution module includes at least one air intake adjacent a first edge, at least one air exit adjacent a second edge, and at least one air directing channel positioned within the module to direct air from the intake towards the exit. The air flow distribution module is configured to fit adjacent a printed circuit board such that the air exiting the module passes over the printed circuit board to provide cooling thereto.

The airflow distribution system of the invention, in the presently preferred embodiments, is structured and configured for use in a chassis which contains or houses multiple printed circuit boards. In this regard, the airflow distribution system will comprise a plurality of airflow distribution modules which are configured to fit within a chassis such that each airflow distribution module is positioned adjacent to a corresponding one of the printed circuit boards. The airflow distribution modules preferably conform to the size and shape of the associated printed circuit boards, and thus the airflow distribution modules will generally be of flat, rectangular configuration, with the air intake or intakes located on a first edge of the module, and the exit port or ports located on a second edge which is substantially perpendicular to the first edge. In this manner, the flow direction of the air received by the intake is substantially perpendicular to the flow direction of the air exiting the module.

Preferably, the airflow distribution modules are positioned within the chassis such that the air intakes of the modules are located adjacent the front of the chassis, and the air exit ports of the modules are located adjacent to a side of the chassis. One or more fans associated with a side of the chassis draw cooling air into the modules through the air intakes, and out of the modules through the air exit ports in a direction which is substantially normal to the direction of airflow entering the intakes, as noted above. The cooling air, after exiting the modules, is drawn across the circuit boards by the fans, and, after passing over and cooling the circuit boards, is exhausted out the side of the chassis.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Figure 1:
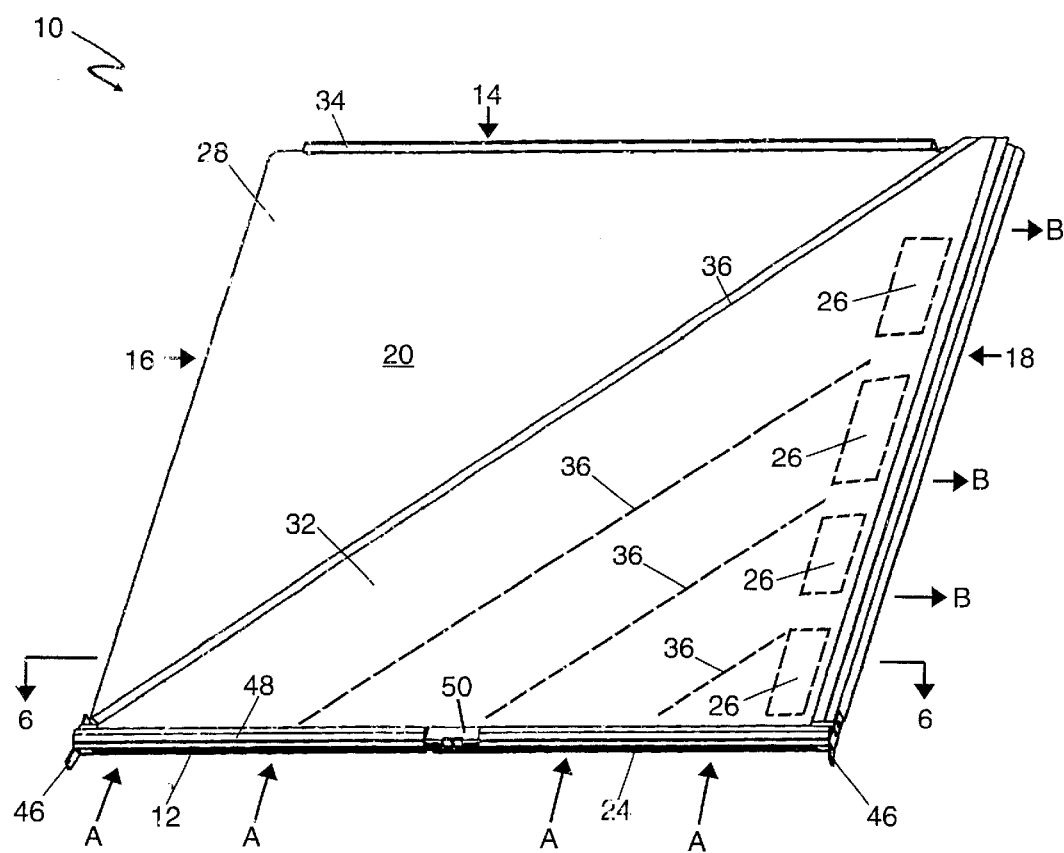
FIG. 1 is a top front perspective view of an air flow distribution module in accordance with the present invention.
Figure 2:
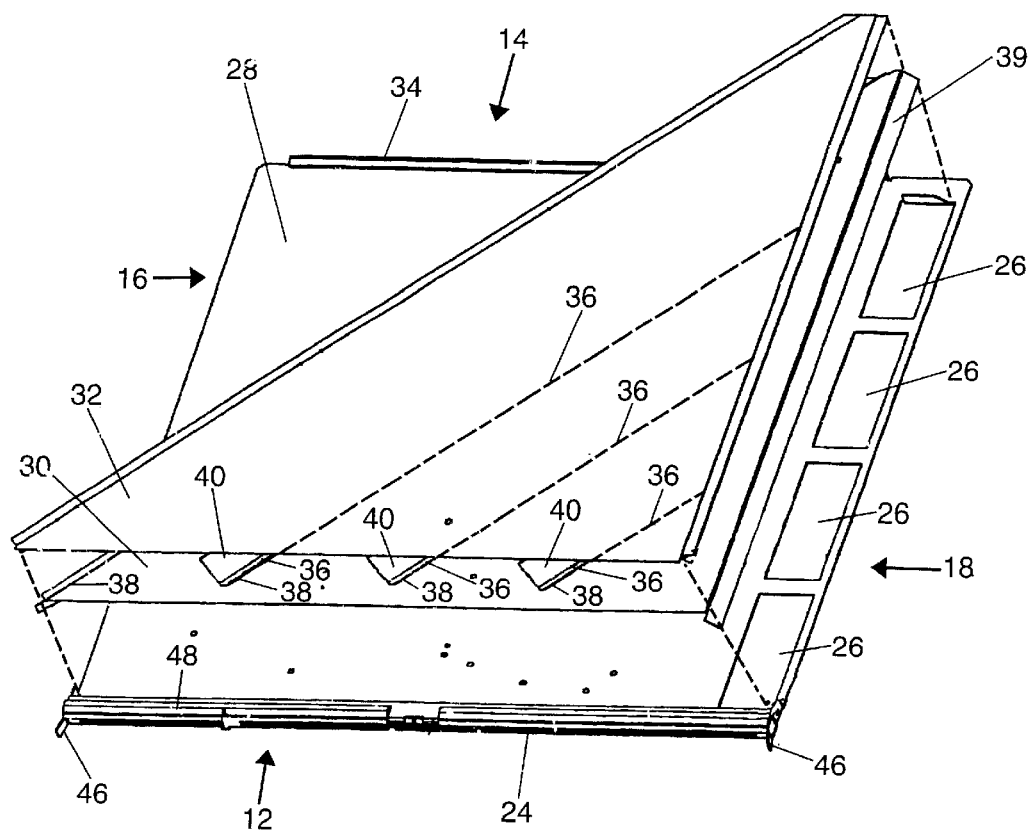
FIG. 2 is a partially exploded view of the air flow distribution module of FIG. 1.
Figure 3:
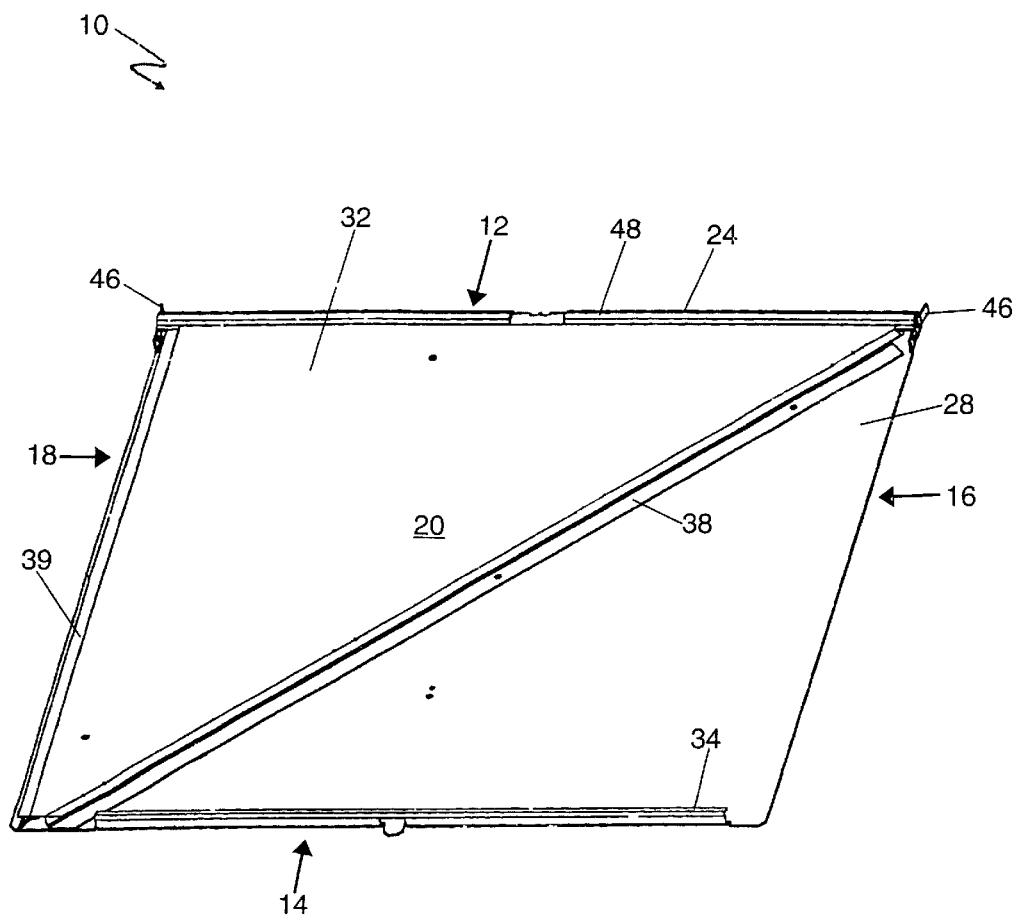
FIG. 3 is a perspective view of the air flow distribution module of FIG. 1 shown from the back.
Figure 4:
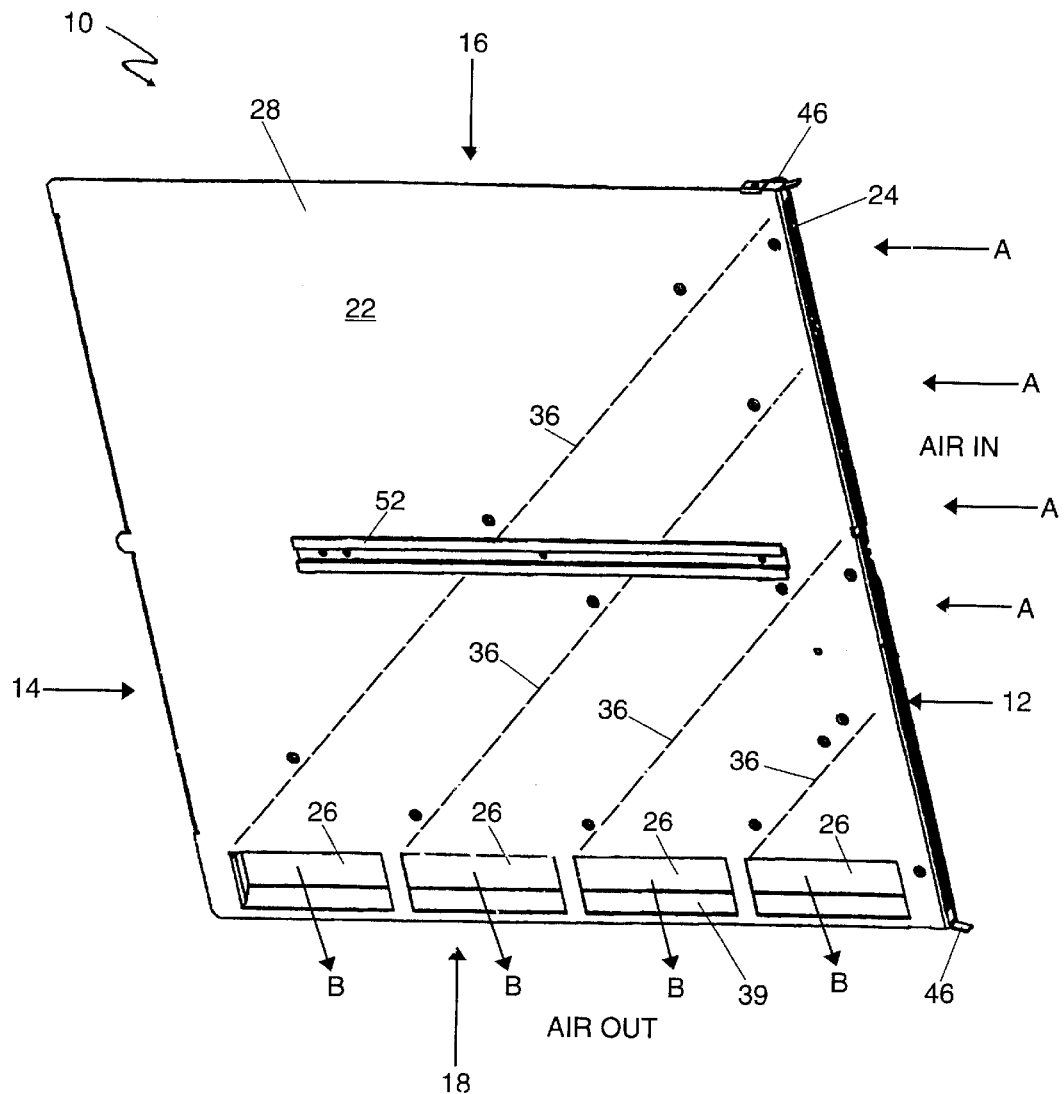
FIG. 4 is a bottom perspective view of the air flow distribution module of FIG. 1.
Figure 5:
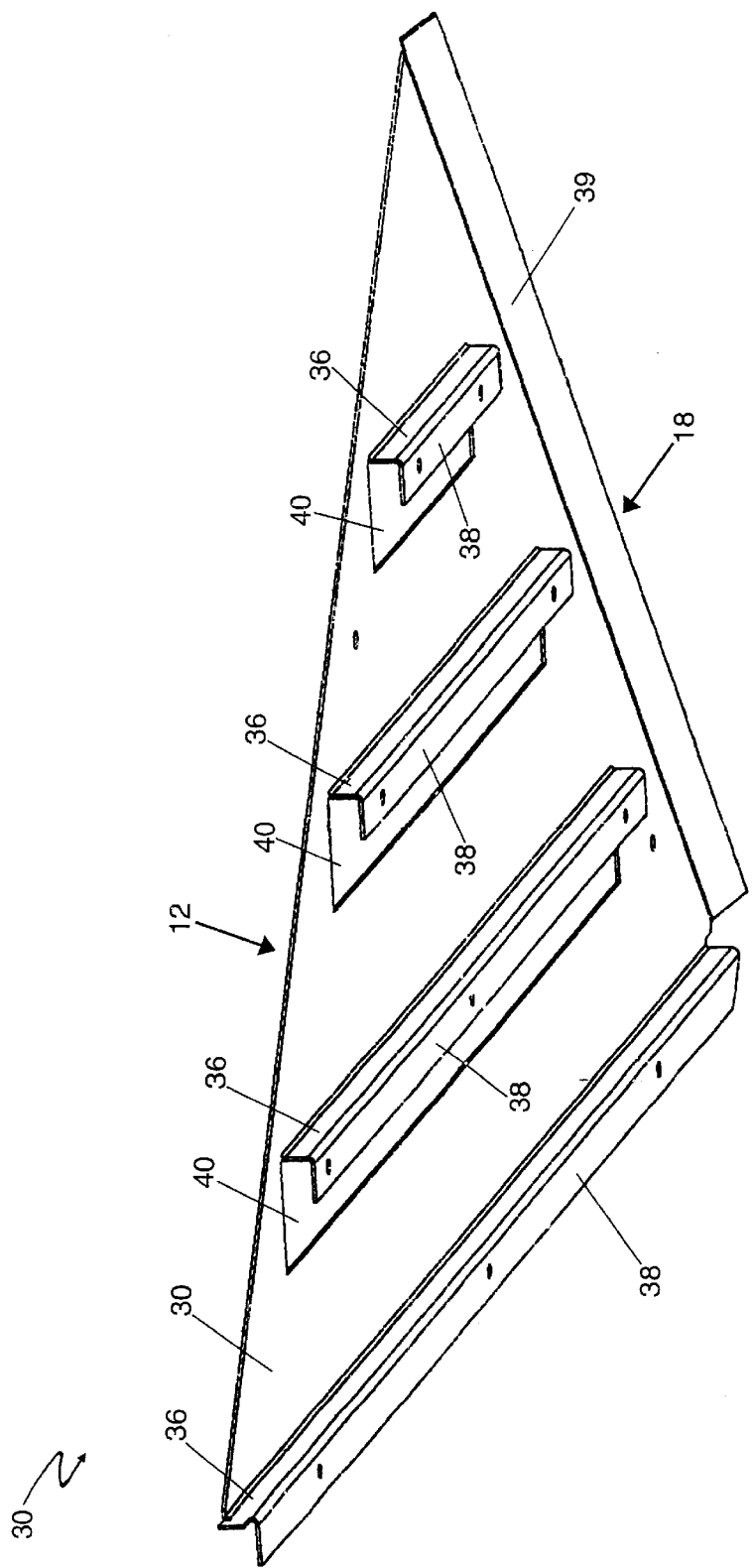
FIG. 5 is a bottom perspective view of the channel plate of FIG. 2.

Referring more specifically to the drawings, for illustrative purposes the present invention is embodied in the air flow distribution system and air flow distribution module shown generally in FIG. 1 through FIG. 12. It will be appreciated that the apparatus may vary as to configuration and as to details of the parts without departing from the basic concepts as disclosed herein. The invention is disclosed generally in terms of use with circuit boards mounted in a chassis, and with air used as a coolant. It should be readily understood by those skilled in the art that the invention may be used to provide cooling in association with a variety of different heat sources, and that coolants or cooling fluids other than air may be used with the invention.

Referring now to FIG. 1 through FIG. 6, there is shown a presently preferred embodiment of an air flow distribution module 10 in accordance with the invention. The air flow distribution module 10 is shown as configured for use in a multiple board chassis (described below) and is of generally flat, rectangular configuration, with front and back edges or sides 12, 14, first and second edges or sides 16, 18, a top surface 20 and a bottom surface (FIG. 4) 22. The module 10 includes generally an elongated air intake port 24 located adjacent the front edge 12, and a plurality of exit ports (FIG. 2, 4) 26 located adjacent the second side 18 of module 10.

The air flow distribution module 10 preferably includes a base plate 28, a channel plate 30 which couples to base plate 28, and a top plate or layer 32 coupled to the channel plate 30. The air intake 24 is preferably located on the base plate 28, with the air intake preferably in the form of an elongated grate or grill structure which is described further below. The air exit ports 26 are also preferably located on base plate 28. Base plate 28 may also include a flange or lip 34 adjacent the back edge 14 to provide structural integrity to base plate 28. Base plate 28 is preferably formed from a single piece of aluminum sheet or other lightweight metal sheet material.

Channel plate 30 is preferably triangular in shape and preferably is structured and configured such that it is approximately one half the size of the rectangular base plate 28. Channel plate 30 includes a plurality of air channel or guide elements 36 which provide directional control of cooling air passing through the module 10. Channel elements 36 each include a flange 38 to facilitate coupling the channel plate 30 to base plate 28. An angled flap or lip 39 is included adjacent side 18 to direct air towards the exit ports 26 in base plate 28. Channel plate 30 is preferably an integral piece made of aluminum sheet or other lightweight metal sheet, and may be formed by conventional metal cutting and bending techniques. Thus, holes 40 in channel plate 30 result from forming some of the channel guides 36 and coupling flanges 38.

Top layer 32 preferably comprises a thin plastic sheet having the same triangular configuration as channel plate. Top layer 32 is preferably joined to channel plate 30 by adhesive, and serves to cover or close the holes 40 in channel plate and prevent escape of air through holes 40.

Figure 6:
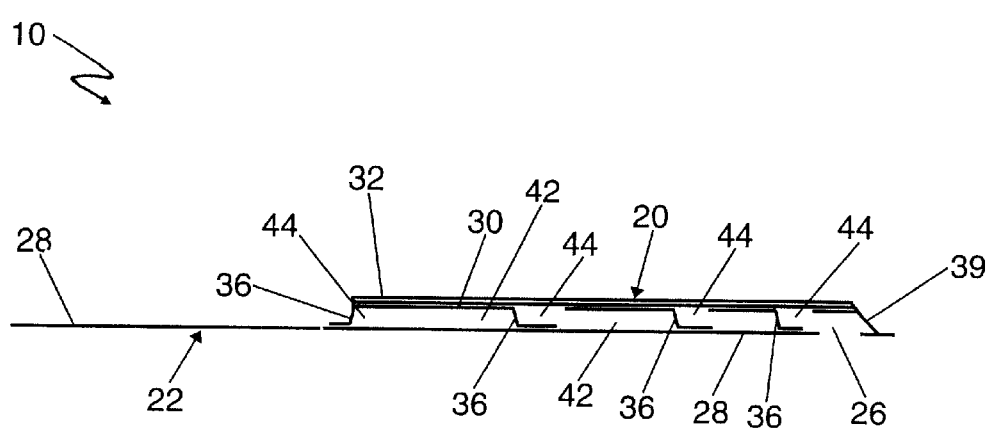
FIG. 6 is a cross-sectional view of the air flow distribution module of FIG. 1 shown through line 6—6.

Referring more particularly to FIG. 6 as well as FIG. 1 through FIG. 5, the assembled base plate 28, channel plate 30 and top plate 32 define an air cavity 42 within the air flow distribution module 10 through which air passes from the air intake 24 to the exit ports 26. Channel elements 36 define a plurality of air channels 44, which are configured to direct cooling air from the air intake of module 10 to the exit ports 26.

The air flow distribution module 10 as shown is structured and configured for use in an air flow distribution system wherein multiple air flow distribution modules are used in association with a chassis containing multiple printed circuit boards, as related further below. In this regard, module 10 includes tabs 46 to facilitate mounting within a chassis. A resilient gasket 48 is included on module adjacent front edge 18. A mesh (not shown) of conductive material may cover gasket 48 to provide electromagnetic shielding. A gap 50 is included in gasket 48 to accommodate mounting hardware associated with the chassis. A coupling rail 52 is included on the bottom surface 20 of module 10 to facilitate coupling of the module 10 to a circuit board (not shown).

The air flow distribution module 10 is configured such that the direction of air entering module 10 occurs in a first direction indicated by flow arrows A, while the direction of air exiting module 10 occurs in a second, different direction indicated by flow arrows B. In the preferred embodiments wherein module 10 is rectangular in configuration, the first air flow direction A associated with air intake 24 is substantially perpendicular or orthogonal to the second air flow direction B associated with air exits 26. This effect is provided by locating air intake 24 on front edge 12, locating the exit ports 26 in association with side edge 18, and configuring the channel elements 36 at an orientation of approximately forty five degrees with respect to the front and side edges 12, 18. Exit ports 26 could alternatively be located adjacent side 16 of module 10, with channel elements 36 re-oriented accordingly to direct air flow through module 10 to the exit ports 26.

The air flow distribution module 10 as shown is configured to conform to the size and shape of a conventional flat, rectangular circuit board configuration. The shape of module 10 however may be varied as required to accommodate circuit boards of a variety of sizes and shapes, and thus the details of module 10 as shown in the drawings and described herein is only exemplary and should not be considered limiting. The size of the air flow cavity 42 within module, 10 may be varied to accommodate larger or smaller volumes of air flow, and the positioning of the intake 24 and exit ports 26 may be varied to provide different air flow directions for different embodiments of the invention.

Figure 7:
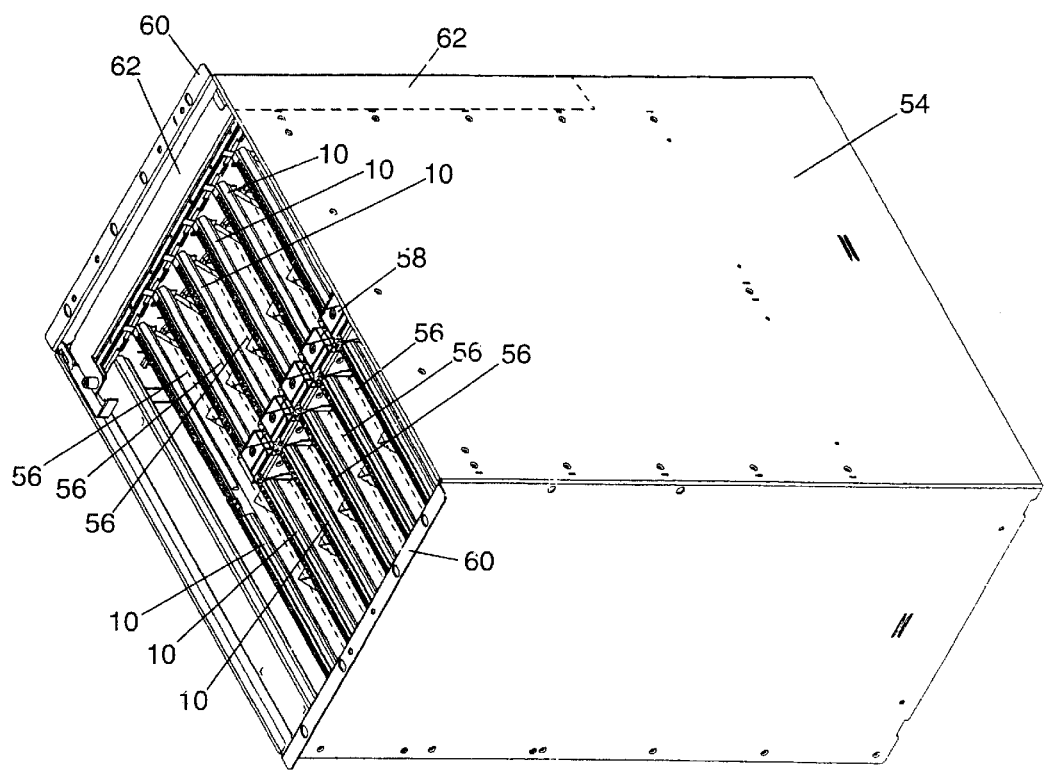
FIG. 7 is a top perspective view of an air flow distribution system in accordance with the present invention wherein multiple air flow distribution modules are associated with a chassis, shown from the front of the chassis.
Figure 8:
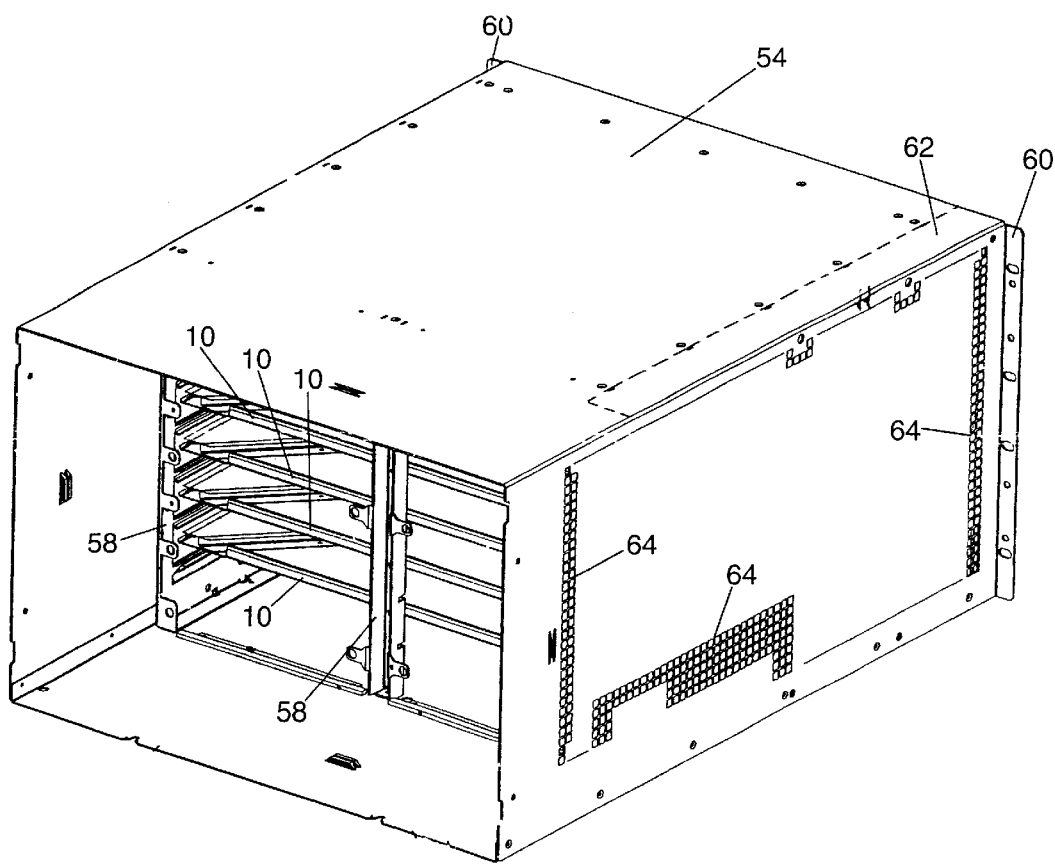
FIG. 8 is a top perspective view of the air flow distribution system of FIG. 7 shown from the back of the chassis.

Referring now to FIG. 7 through FIG. 12, an air flow distribution system comprising a plurality of air flow distribution modules 10 is shown in association with a chassis 54. A plurality of circuit boards 56, shown schematically as dashed lines in FIG. 7, are included in chassis 54, with each air flow distribution module 10 positioned adjacent to a corresponding circuit board 56. Chassis 56 includes an internal rack or frame assembly 58 which supports the air flow distribution modules 10 and circuit boards 56. Flanges 60 on chassis 54 are provided to allow chassis 54 to be mounted in an external frame (not shown) as is well known in the art. A fan assembly 62, which includes one or more fans (not shown), is included on one side of chassis 54 to provide air flow for cooling the internal circuit boards 56. An exhaust grating 64 in the side of chassis provides an escape route for air from the fan assembly 62.

Figure 9:
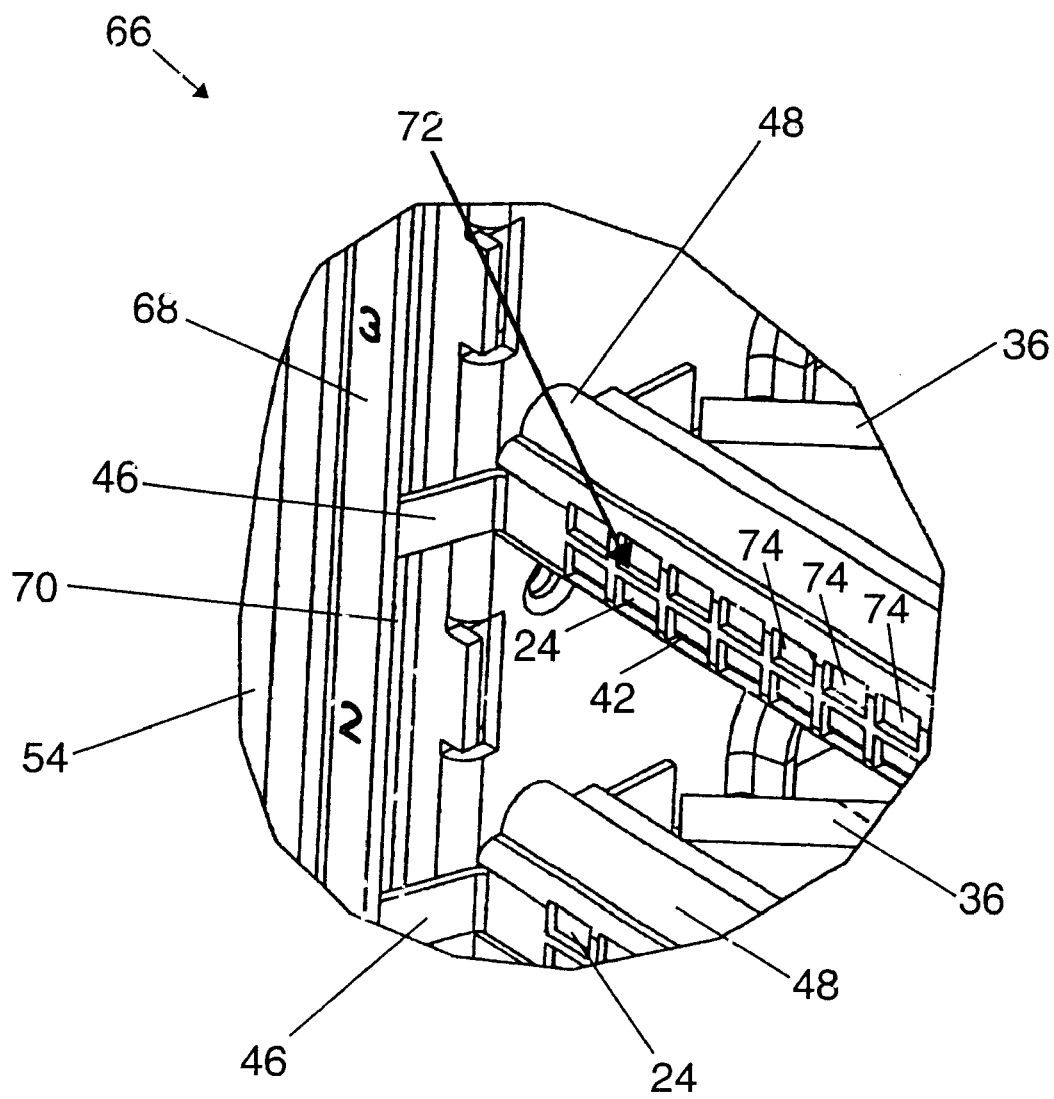
FIG. 9 is a perspective view of the module-chassis coupling assembly.
Figure 10:
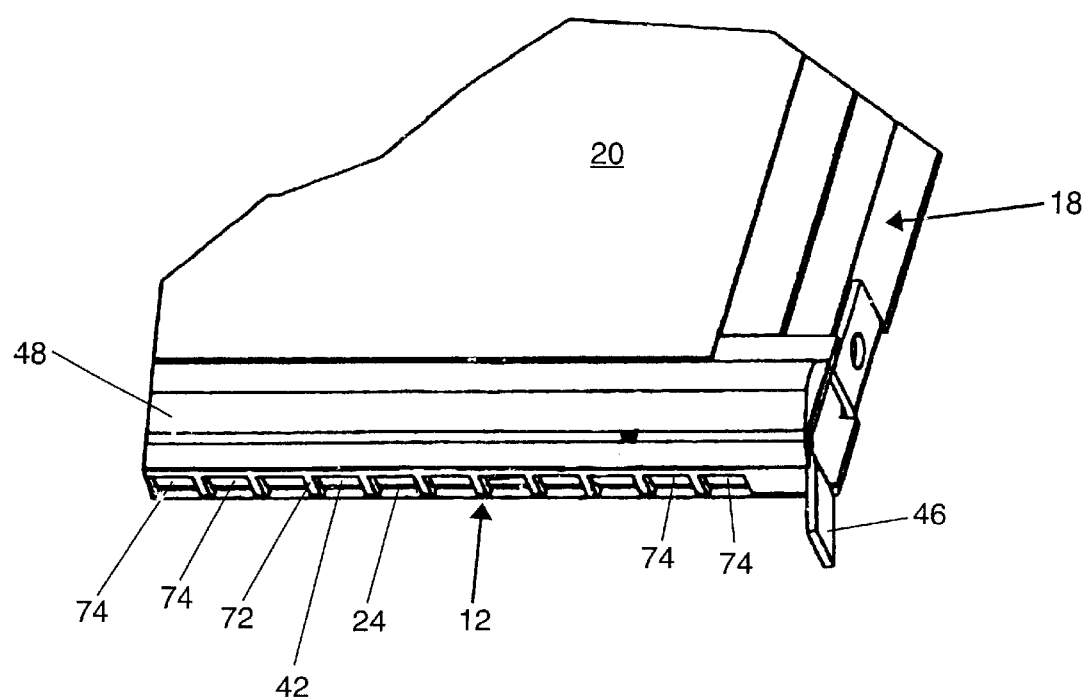
FIG. 10 is a perspective view of a front corner of the air flow distribution module of FIG. 1.

FIG. 9 shows a detail of the module coupling assembly 66 of FIG. 7. The is coupling assembly comprises a lip or flange 68 on chassis that defines a recess 70 structured and configured to accommodate the tabs 46 on air flow distribution modules 10. Tabs 46 are resilient and "snap-fit" behind the flange 68 to hold each module 10 within chassis 54. The modules 10 are mounted in chassis 54 by inserting the modules into chassis 54 and sliding the modules inward along the internal rack assembly 58 until tabs 46 snap fit behind flanges 68. FIG. 10 shows that tab 46 is slightly angled so that tab 46 will be retained behind flange 68. The modules can be released and removed from the chassis 54 by bending tabs 46 with a screwdriver or like suitable tool such that the tabs 46 are removed from the recess 70 behind flange 68.

FIG. 9 and FIG. 10 additionally provide a detailed view of a portion of the air flow module 10 that shows a grating or grill 72 positioned over the air intake 24 on front edge 18 of module 10. Grill 72 defines a plurality of openings 74 which communicate with the air cavity 42 inside the module 10.

Figure 11:
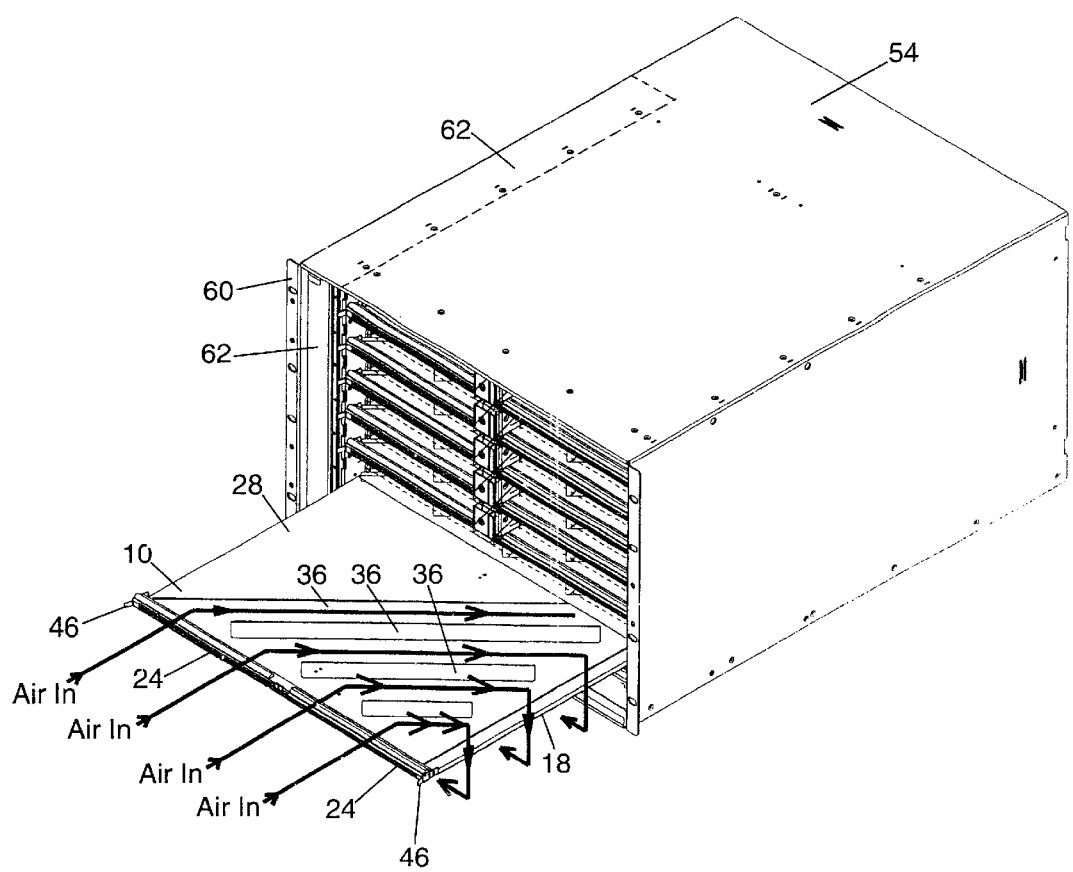
FIG. 11 shows the air flow distribution system of FIG. 7 with one air flow distribution module partially removed from the chassis to illustrate the direction of air flow associated with the air intake and air exit ports of the module.
Figure 12:
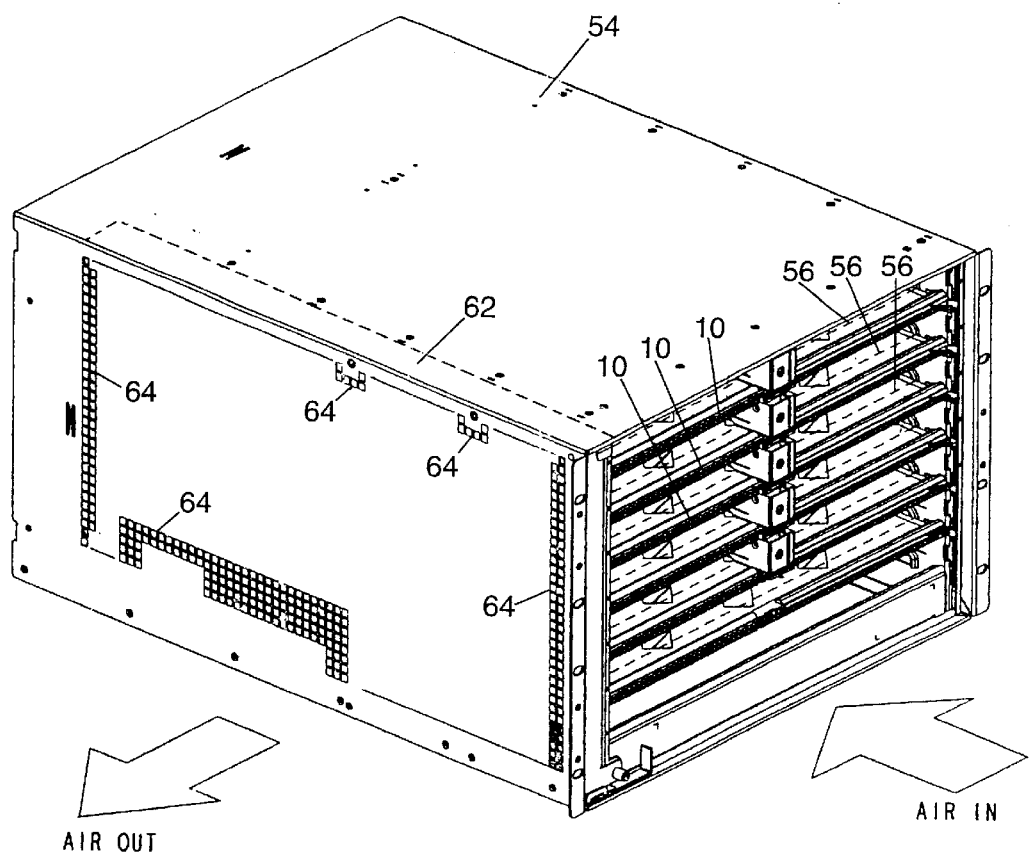
FIG. 12 illustrates the flow direction of cooling air and exhaust air associated with the air flow distribution system of FIG. 7.

The operation of the air flow distribution system is illustrated in FIG. 11 and FIG. 12. In operation, fan assembly 62 is configured to drive air in the direction indicated by the "AIR OUT" arrow in FIG. 12. As shown in FIG. 12 and described above, cooling air is drawn into each module 10 through the air intake 24 on the module front edge. The cooling air enters the internal air cavity 42 (FIG. 6) and is directed via channel elements 36 towards the exit ports 26 (FIG. 4) on the side 18 of module 10. Once the cooling air exits the modules 10, the cooling air is drawn under each module 10 towards the fan assembly 62 of the chassis, as seen most clearly in FIG. 11. As the cooling air is drawn towards the fan assembly 62, the cooling air passes over the circuit boards 56 (FIG. 7) adjacent to and beneath each module 10, so that the circuit boards 56 are cooled by the air flow. After passing over the circuit boards 56, the (now warmed) exhaust air passes through fan assembly 62 and exits the exhaust grill 64 on the side of chassis, as indicated by the "AIR OUT" arrow in FIG. 12. In this manner, cooling air enters the modules 10 of the air flow distribution system in a first direction, and is exited or exhausted in a second direction at generally a right angle to the first direction.

The air flow distribution modules 10 of the invention thus provide directional control for cooling air input and exhaust air output in association with a multi-board chassis 54. The directional control provided by the invention allows multiple chassis 54 to be arranged "in-line" or front-to-back, since the exhaust air from each chassis 54 exits to the side, in a direction perpendicular to the input cooling air, and the exhaust air from one chassis 54 will not interfere with an adjacent chassis 54. The air flow distribution provided by the invention also allows vertical stacking of chassis 54 within a frame, since exhaust air from each chassis exits to the side, and will not interfere with cooling in adjacent chassis 54 positioned above or below.

The arrangement of modules 10 within chassis 54 as described above is only one particular configuration for an air flow distribution system in accordance with the invention, and numerous additional embodiments of the air flow distribution module 10 and the positioning of modules 10 within chassis 54 are possible. For example, the fan assembly 62 and air flow distribution modules 10 may be positioned such that cooling air flow enters the front of the chassis 54 and is exhausted through the top or bottom of the chassis instead of the sides. Further, in embodiments where a greater degree of cooling is required, dual fan assemblies may be used in a chassis, with modules 10 configured to direct air to each side, so that exhaust air exits both sides of the chassis 54. Modules 10 may also be configured for use with coolants other than air. Various other arrangements for modules 10 and chassis 54 will suggest themselves to those skilled in the art, and are considered to be within the scope of this disclosure.

Accordingly, it will be seen that this invention provides a modular air flow distribution system which allows directional control of cooling air intake and exiting exhaust air for computer housings and circuit board chassis. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. An air flow distribution module mountable in a chassis comprising:

a base plate having a front edge and a back edge opposite to said front edge, a first side and a second side opposite thereof, said first and said second side being located substantially orthogonal to said front side, a top surface and a bottom surface opposite thereof, said base plate having a plurality of ports adjacent said second side;

a channel plate mountable to said top surface, said channel plate including a lip located orthogonal to said front edge, said lip being mountable adjacent said second side proximate said ports of said base plate, said channel plate having at least one channel;

at least one air cavity formed between said base plate, said channel plate and said at least one channel, said at least one air cavity being in fluid communication with said front edge and said ports, wherein a cooling fluid is fluidly coupled between said front edge and said ports;

a circuit board mountable to said base plate, wherein said base plate, said channel plate, said at least one air cavity and said circuit board are separable from a fan.

2. The air flow distribution module of claim 1, further comprising:

an air intake located adjacent said font edge;

an air exit located proximate said ports, wherein air is drawn into said air intake in a first direction and fluidly coupled through said at least one air cavity in a second direction to said air exit and discharged from said air exit in a third direction.

3. The air flow distribution module of claim 1, wherein the chassis includes a front face oriented vertically and a side wall adjacent and orthogonal to said front face, and said air flow distribution module is mountable in the chassis normal to said front face, wherein said first direction is substantially along a horizontal plane normal to said front face and said second direction is off-normal from said front face along said horizontal plane and said third direction is orthogonal to said first direction along a vertical plane parallel with said front face.

4. The air flow distribution module of claim 3, wherein there are a plurality of said air flow modules adapted to be arranged in a horizontal stack in the chassis and said cooling fluid is directed in a fourth direction substantially normal to said third direction.

5. The air flow distribution module of claim 4, wherein the fan is adapted to be coupled with the chassis separate from said air flow distribution module, wherein the fan draws said cooling fluid into said air intake in said first direction, through said at least one air cavity in said second direction, through said exit in said third direction and across the circuit board in said fourth direction to the fan and discharges said cooling fluid out of the chassis in a direction substantially perpendicular to said first direction.

6. The air flow distribution module of claim 1, wherein said bottom surface of said base plate is adapted to be contiguous with the circuit board.

7. The air flow distribution module of claim 3, wherein the chassis is vertically stackable with another chassis, wherein the cooling fluid is discharged out of the side of the chassis.

* * * * *